(12) United States Patent
Huang et al.

(10) Patent No.: US 8,099,701 B2
(45) Date of Patent: Jan. 17, 2012

(54) EFFICIENT CHIP ROUTING METHOD AND APPARATUS FOR INTEGRATED CIRCUIT BLOCKS WITH MULTIPLE CONNECTIONS

(75) Inventors: Dajen Huang, Santa Clara, CA (US); Yi Wu, Santa Clara, CA (US); Robert R. Brown, Santa Clara, CA (US)

(73) Assignee: Oracle America, Inc., Redwood City, CA (US)

( * ) Notice: Subject to any disclaimer, the term of this patent is extended or adjusted under 35 U.S.C. 154(b) by 408 days.

(21) Appl. No.: 12/395,444

(22) Filed: Feb. 27, 2009

(65) Prior Publication Data

US 2010/0223587 A1 Sep. 2, 2010

(51) Int. Cl.
*G06F 17/50* (2006.01)
(52) U.S. Cl. .......................... 716/126; 716/125; 716/139
(58) Field of Classification Search .......... 716/125–126, 716/139
See application file for complete search history.

(56) References Cited

U.S. PATENT DOCUMENTS

| | | | | |
|---|---|---|---|---|
| 5,537,332 A | * | 7/1996 | Bolliger et al. | 716/123 |
| 5,648,913 A | * | 7/1997 | Bennett et al. | 716/113 |
| 5,943,486 A | * | 8/1999 | Fukui et al. | 716/123 |
| 6,507,932 B1 | * | 1/2003 | Landry et al. | 716/103 |
| 6,536,028 B1 | * | 3/2003 | Katsioulas et al. | 716/125 |
| 7,356,784 B1 | * | 4/2008 | Dengi et al. | 716/113 |
| 2006/0053396 A1 | * | 3/2006 | Eng | 716/7 |
| 2006/0248485 A1 | * | 11/2006 | Foreman et al. | 716/6 |
| 2009/0070731 A1 | * | 3/2009 | Zhang | 716/19 |
| 2009/0224408 A1 | * | 9/2009 | Fox | 257/773 |
| 2010/0031214 A1 | * | 2/2010 | Hou et al. | 716/9 |
| 2010/0185995 A1 | * | 7/2010 | Pikus et al. | 716/5 |

* cited by examiner

*Primary Examiner* — Naum Levin
(74) *Attorney, Agent, or Firm* — Polsinelli Shughart, PC

(57) ABSTRACT

Methods and apparatuses are disclosed for improving the speed of chip routing for integrated circuit blocks with multiple connections. In some embodiments, the method may include creating a layout abstract for a first block and a second block of the integrated circuit, where the first and second blocks are coupled together via a plurality of connections. The method may further include determining whether the number of connections in the plurality exceeds a threshold, and in the event that the number of connections exceeds the predetermined threshold, representing a first subset of the plurality as a first logical connection.

17 Claims, 10 Drawing Sheets

EFFICIENT CHIP ROUTING METHOD AND APPARATUS FOR INTEGRATED CIRCUIT BLOCKS WITH MULTIPLE CONNECTIONS

FIELD OF THE INVENTION

The present invention relates generally to integrated circuit design, and more particularly to improving the speed of chip routing for integrated circuit blocks with multiple connections.

BACKGROUND

Electronic devices are ubiquitous in society and can be found in everything from wristwatches to computers. The complexity and sophistication of these electronic devices usually increases with each generation. For example, newer generations of microprocessors often implement multiple processing "cores" on a single integrated circuit (IC), where each core may be capable of concurrently executing at least some of the program code. While implementing these multiple cores on a single IC may be advantageous in that the processor may be capable of increased processing power, implementing these multiple cores on a single IC may present new challenges in terms of designing and building the IC. One aspect of IC design that may be especially problematic for multi-core processors is chip routing.

The term "chip routing", as used herein, refers to the final stages of IC design where the various constituent blocks of the IC are brought together in a chip floor plan and are coupled together. Chip routing often involves taking constituent blocks in an IC design (e.g., processor core blocks, memory controller blocks, network controller block, etc.), placing the constituent blocks within the confines of a minimum physical area (i.e., creating a proposed floor plan), and routing electrical connections between the different blocks and between the pins of the IC. Once the constituent blocks have been placed and routed, the timing of signals between various blocks in the proposed floor plan needs to be "verified" using computer simulations. In other words, if the IC is expected to operate at a desired frequency, computer simulations may be performed to verify that the proposed floor plan and routing do not prevent IC operation at the desired frequency. If the computer simulations show that the proposed routing in the proposed floor plan prevents the IC from operating at the desired frequency, electrical signals must be re-routed to improve the timing of the signals. Other reasons that the routing process may need to be started over again include: if the number or orientation of a constituent blocks changes while the proposed floor plan is being created, if the manufacturing process in the foundry changes while the floor plan is being created, and/or if the desired operating frequency of the IC changes. Needless to say, because there may be many connections between blocks in conventional ICs (e.g., a multi-bit bus between cores in a multi-core processor), the desire to pack the constituent blocks of the IC into the smallest possible area, and aggressive timing goals (e.g., desire to run the multi-core processor as fast as possible), each iteration of the chip re-routing process may consume a considerable amount of time

SUMMARY

Methods and apparatuses are disclosed for improving the speed of chip routing for integrated circuit blocks with multiple connections. In some embodiments, the method may include creating a layout abstract for a first block and a second block of the integrated circuit, where the first and second blocks are coupled together via a plurality of connections. The method may further include determining whether the number of connections in the plurality exceeds a threshold number, and in the event that the number of connections exceeds the threshold number, representing a first subset of the plurality as a first logical connection.

Other embodiments may include a computer readable storage medium comprising a plurality of computer readable instructions, the instructions including creating a layout abstract for a first block and a second block of an integrated circuit, where the first and second blocks are coupled together via a plurality of connections. The instructions may further include determining whether the number of connections in the plurality exceeds a threshold number, and in the event that the number of connections exceeds the threshold number, representing a subset of the plurality as a logical connection.

Still other embodiments may include a layout representation of an integrated circuit, the representation including one or more layers indicating the processing steps used during the manufacture of the integrated circuit, one or more layers indicating the size and location of a plurality of blocks within the integrated circuit, and one or more layers indicating the location of a plurality of pins associated with two or more blocks within the plurality, wherein the plurality of pins represented as a subset of the actual number associated with each block.

DETAILED DESCRIPTION

In some embodiments, methods and apparatuses may be provided for improving the speed of chip routing for blocks with multiple connections between these blocks. This may include creating a layout representation of a proposed floor plan of the chip. The layout representation may be modified to include a reduced number of connections as compared to the actual connections of the number of connections between blocks. For example, the number of connections may be reduced in a manner that capitalizes on similar routing topologies between one or more of the connections. When the layout representation with this reduced set of connections are simulated, the overall simulation time may be less than if all the connections were included in the layout representation. By reducing the simulation time associated with the layout representation, the overall time associated with arriving at a final floor plan may be reduced.

While one or more embodiments may be discussed in the context of a processor, the chip routing techniques disclosed herein may be applied to a wide variety of chip design scenarios.

Figure 1:
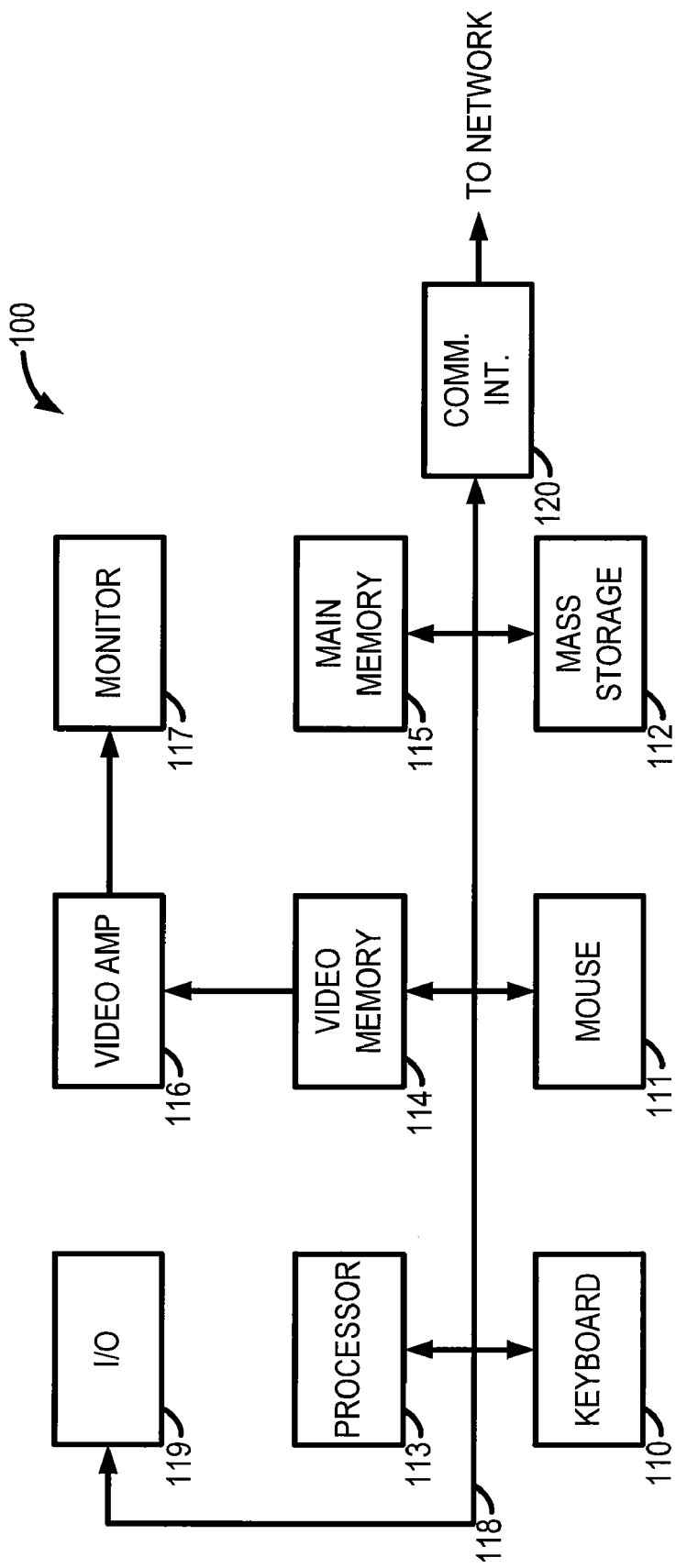
FIG. 1 illustrates an example of a computer system.

FIG. 1 illustrates a computer system 100 including a processor designed in such a way as to improve the speed with which the computer system's 100 constituent blocks are coupled together during the final stages of design. In some embodiments, the computer system 100 may be an implementation of enterprise level computers, such as one or more blade-type servers within an enterprise. In other embodiments, the computer system 100 may be a personal computer and/or a handheld electronic device. A keyboard 110 and mouse 111 may be coupled to the computer system 100 via a system bus 118. The keyboard 110 and the mouse 111, in one example, may introduce user input to the computer system 100 and communicate that user input to a processor 113. Other suitable input devices may be used in addition to, or in place of, the mouse 111 and the keyboard 110. An input/output unit 119 (I/O) coupled to a system bus 118 represents such I/O elements as a printer, audio/video (A/V) I/O, etc.

Computer 100 also may include a video memory 114, a main memory 115 and a mass storage 112, all coupled to the system bus 118 along with the keyboard 110, the mouse 111 and the processor 113. The mass storage 112 may include both fixed and removable media, such as magnetic, optical or magnetic optical storage systems and any other available mass storage technology. The bus 118 may contain, for example, address lines for addressing the video memory 114 or the main memory 115. In some embodiments, the main memory 115 is a fully buffered dual inline memory module (FB-DIMM) that communicates serially with other system components.

The system bus 118 also may include a data bus for transferring data between and among the components, such as the processor 113, the main memory 115, the video memory 114 and the mass storage 112. The video memory 114 may be a dual-ported video random access memory. One port of the video memory 114, in one example, is coupled to a video amplifier 116, which is used to drive a monitor 117. The monitor 117 may be any type of monitor suitable for displaying graphic images, such as a cathode ray tube monitor (CRT), flat panel, or liquid crystal display (LCD) monitor or any other suitable data presentation device.

In some embodiments, the processor 113 is a multi-core SPARC® microprocessor from Sun Microsystems, Inc, although any other suitable microprocessor or microcomputer may be utilized. The processor 113, and the methods and apparatuses used to improve the speed with which the processor's 113 constituent blocks are routed together, are described in more detail below with regard to FIGS. 2A-6.

The computer system 100 also may include a communication interface 120 coupled to the bus 118. The communication interface 120 provides a two-way data communication coupling via a network link. For example, the communication interface 120 may be a local area network (LAN) card, or a cable modem, and/or wireless interface. In any such implementation, the communication interface 120 sends and receives electrical, electromagnetic or optical signals that carry digital data streams representing various types of information.

Code received by the computer system 100 may be executed by the processor 113 as the code is received, and/or stored in the mass storage 112, or other non-volatile storage for later execution. In this manner, the computer system 100 may obtain program code in a variety of forms. Program code may be embodied in any form of computer program product such as a medium configured to store or transport computer readable code or data, or in which computer readable code or data may be embedded. Examples of computer program products include CD-ROM discs, ROM cards, floppy disks, magnetic tapes, computer hard drives, servers on a network, and solid state memory devices.

Figure 2A:
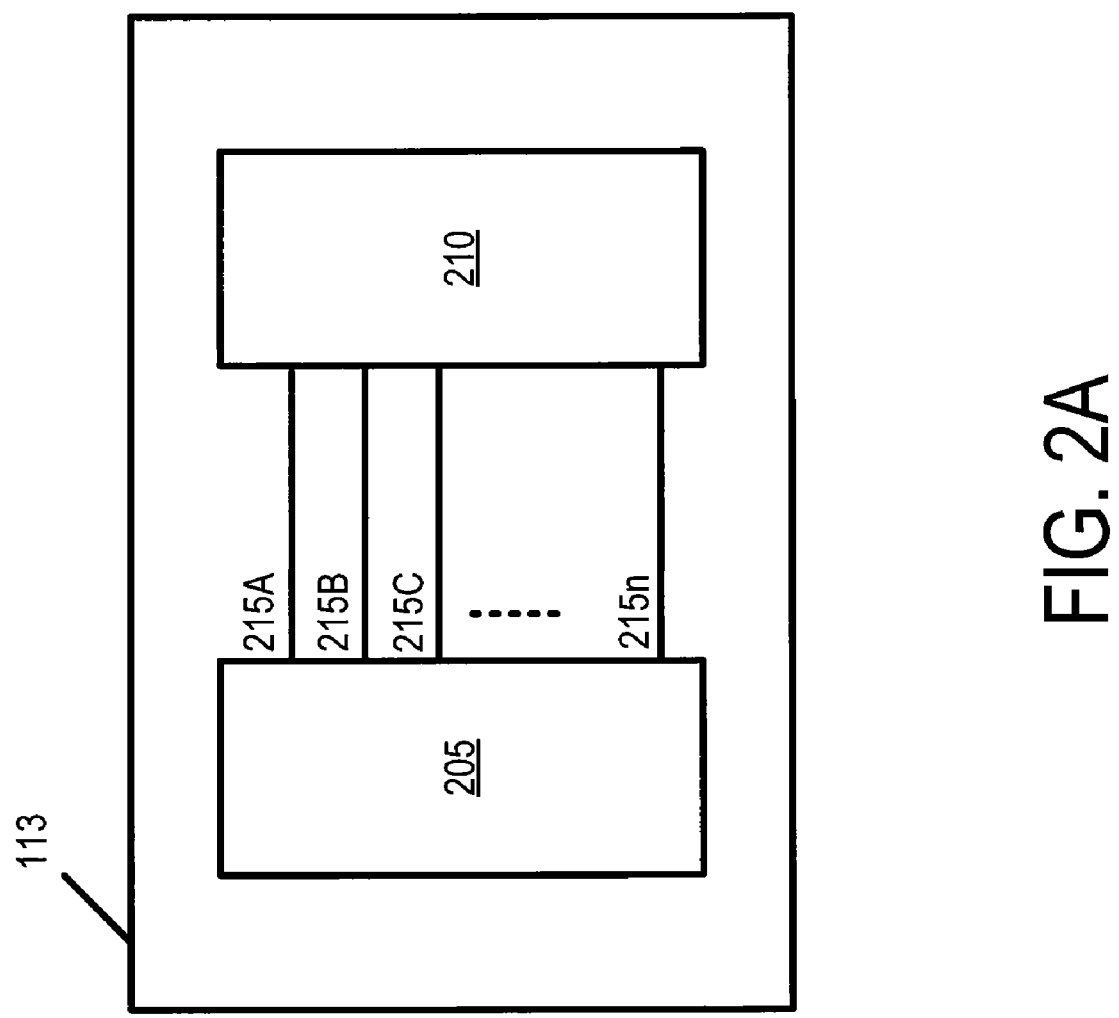
FIG. 2A illustrates an example of an IC.

FIG. 2A illustrates the processor 113 in greater detail including constituent circuit blocks 205 and 210. Blocks 205 and 210 may include any variety of circuits typically found in an IC (e.g., timing blocks, processor core blocks, power control blocks, memories, etc.) Although only two blocks 205 and 210 are shown in FIG. 2A for the sake of clarity, one of skill in the art would appreciate that numerous blocks are possible.

During the final stages of designing the processor 113, a proposed floor plan is created for the constituent blocks 205 and 210 that attempts to minimize the area consumed by the proposed floor plan. Once a proposed floor plan is in place, the blocks 205 and 210 are connected together in a proposed arrangement via a plurality of connections 215A-n, where the overall number of connections may be related to the specific configuration of the blocks 205 and 210. In some embodiments, the connections 215A-n may be made from various metals (aluminum, copper, etc.) and/or polysilicon, such as salicided polysilicon. As described in more detail below, this proposed arrangement of connections 215A-n may be subsequently tested to determine if the proposed arrangement of connections 215A-n will prevent the IC from operating at a desired frequency.

Often the connections 215A-n form a bus, and the connections 215A-n may be referred to as "bit lines" because each connection may convey one or more bits of data. For example, in some embodiments, the block 205 is a processor core and the block 210 is a cache memory and the connections 215A-n may be bit lines that communicate data between the processor core and the cache memory. While FIG. 2A depicts the connections 215A-n as straight line connections between the blocks 205 and 210 for the sake of clarity, one of skill in the art will appreciate that more complicated connections, such as connections with diagonal sections or sections that include multiple sections of differing metals, are often employed.

With the blocks 205 and 210 arranged in a proposed floor plan, and the blocks 205 and 210 speculatively connected via the connections 215A-n, computer simulations are performed to determine if the proposed floor plan will prevent the processor 113 from operating at the desired operating frequency. To perform computer simulations on the proposed floor plan, a representation of the proposed floor plan is created that emulates the electrical characteristics of the connections 215A-n. The representation of the proposed floor plan is sometimes referred to as a "layout-parasitic-extraction" (LPE) representation and often includes parasitic electrical elements such as capacitors, resistors, inductors, and/or transistors that arise by virtue of the placement of electronic devices and/or their connectivity in the physical IC layout. The parasitic devices may be "extracted" or modeled such that a circuit representation may be simulated containing not only the intentionally placed devices but extracted devices that may affect circuit performance as well.

Figure 2B:
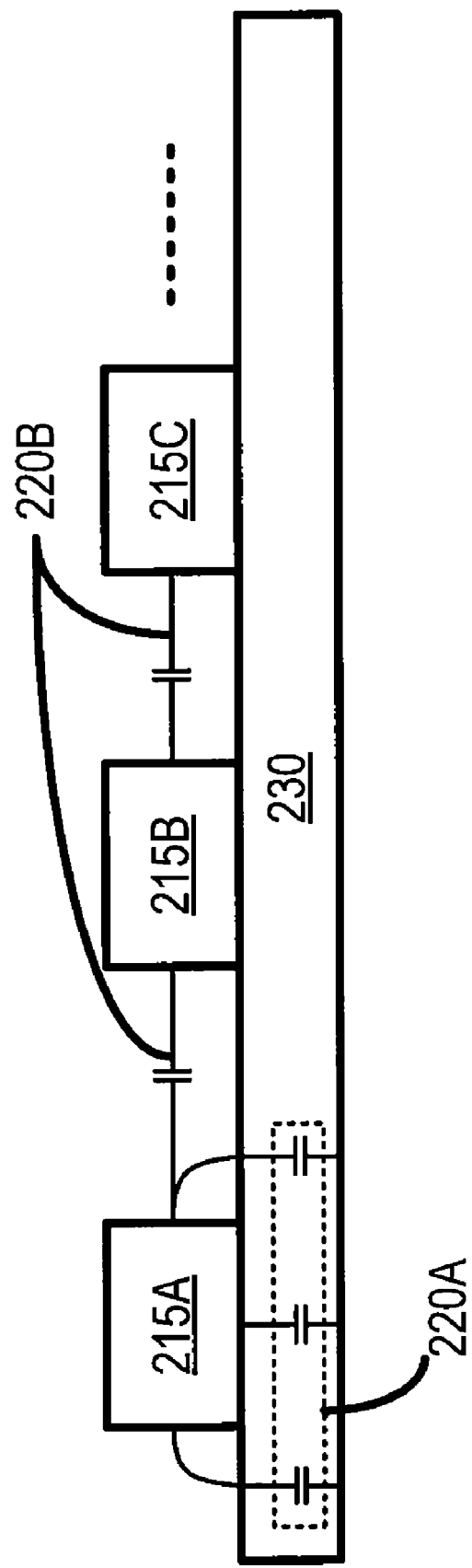
FIG. 2B illustrates potential parasitic electrical elements in an IC.

The parasitic electrical elements may arise from a variety of mechanisms. For example, FIG. 2B illustrates examples of parasitic capacitances 220A that may arise because each connector 215A sits on an insulating layer 230. Although not shown, the capacitance 220A may exist for each connector in the connections 215A-n. FIG. 2B also illustrates examples of parasitic capacitances 220B that may exist between adjacent conductors 215B-C. Also, although not shown, the capacitances 220B may exist between each of the adjacent connections 215A-n. In fact, actual LPE representations of the processor 113 may be affected by various items such as the particular materials that the connections 215A-n are made of, the routing length of the connections 215A-n, the distance between the connections 215A-n, and/or the width of the connections 215A-n to name but a few.

Figure 2C:
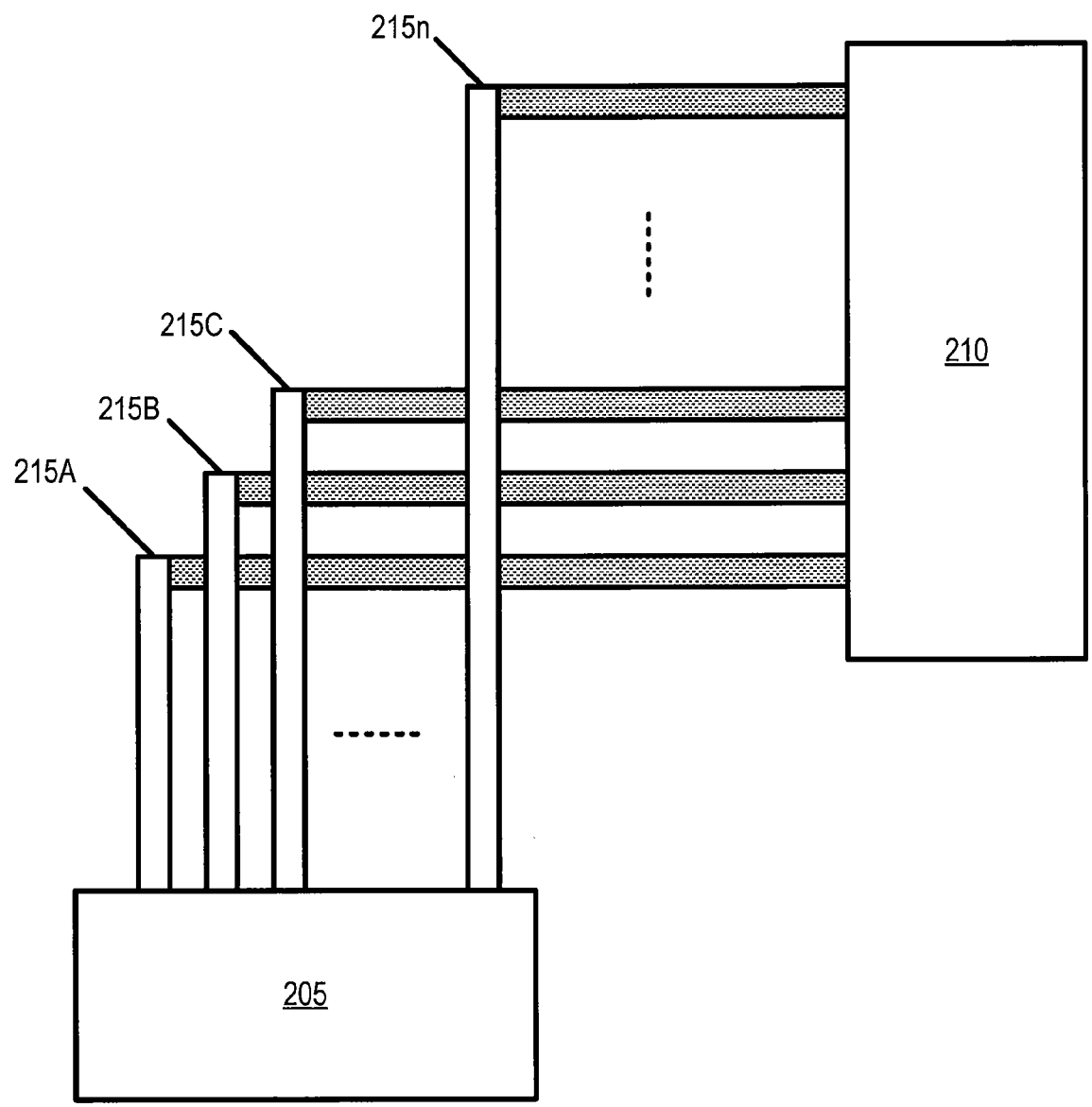
FIG. 2C illustrates one embodiment of routing connections in an IC.
Figure 2D:
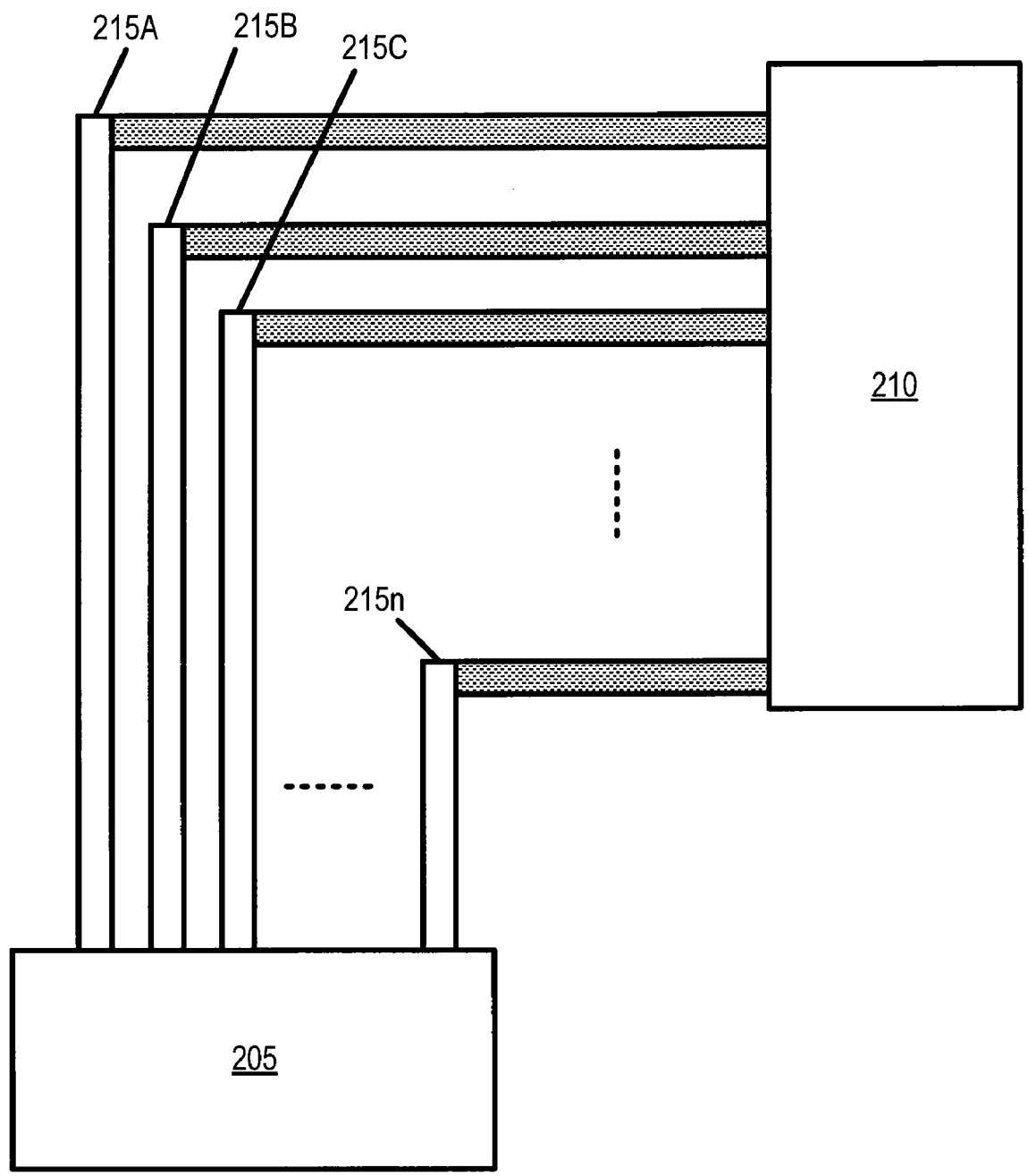
FIG. 2D illustrates yet another embodiment of routing connections in an IC.

FIGS. 2C-D illustrate two potential embodiments of the connections 215A-n for which the timing of signals may vary. In some embodiments, the arrangement of connections shown in FIGS. 2C-D may be the result of automated routing software determining an optimum configuration for the connections 215A-n, while in other embodiments, the connections 215A-n may be routed manually.

Referring to FIGS. 2C-D, portions of the connections 215A-n are shown in stipple shading to indicate that the materials used in the connections 215A-n may be different. For example, the blank portion may indicate that portion of the connection is formed with a metal 1 layer, or the first layer of metal available in the IC process, while the stippled portion of the connection may indicate that that portion is formed using a metal 2 layer. Of course, numerous materials in various combinations may be used to form each of the connections 215A-n and there may be intermediate materials, such as vias, that may couple the numerous materials together. In some embodiments, the vias may be made from tungsten.

Comparing FIGS. 2C-D, the connections 215A-n shown in FIG. 2C have substantially similar topology because they have approximately the same length and/or may utilize the same proportions of different metals, while the connections in 215A-n shown in FIG. 2D have differing topology because the connections 215A-n have differing lengths and/or may utilize differing proportions of the same metals or different metals entirely. Referring to the embodiment shown in FIG. 2C, the connections 215A-n may have approximately the same length and same proportion of metal configuration from beginning to end. For example, the difference in length between the connections 215A-n shown in FIG. 2C may be no greater than 10%. Also, in some embodiments, the connections 215A-n shown in FIG. 2C may be manufactured such that 50% of the connections' 215A-n overall length is made of metal1 and the other 50% of the connections' 215A-n overall length is made from metal2. Thus, the LPE representation of each individual connection 215A-n shown in FIG. 2C may be similar. This may be especially true with regard to the connections that are internal to the bus, e.g., 215B and 215C, because connectors on the edge of the bus, e.g., 215A, only have one adjacent connector and therefore may not have a parasitic capacitance 220B on both sides as may be the case for the internal connectors.

The connections 215A-n shown in FIG. 2D, on the other hand, may have overall lengths that vary. That is, the connection 215A may be longer than the other connections 215B-n and the connections 215n may be shorter than the other connections 215A-215n-1. As a result, unlike the embodiment shown in FIG. 2C, the LPE representation of each individual connection 215A-n shown in FIG. 2D may be different from each other.

Needless to say, determining each of the relevant parasitic electrical elements for each connection in the processor 113 may be a time consuming and computationally intense endeavor. Furthermore, in the event that the proposed floor plan fails to pass a requisite test, the process of floor planning, routing the proposed floor plan, and simulating an LPE representation of the proposed floor plan may need to be performed recursively until an acceptable floor plan is achieved.

Figure 3:
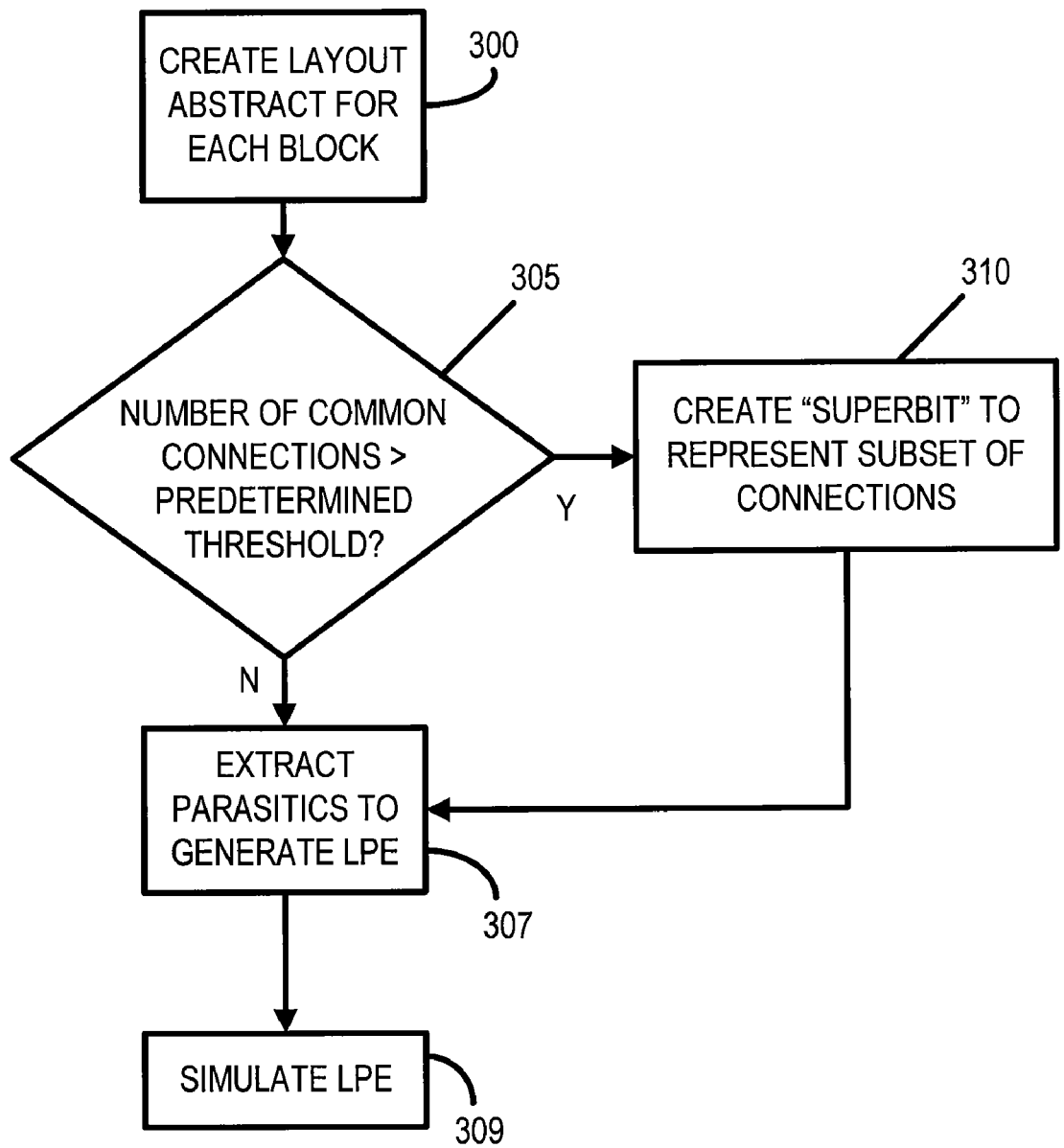
FIG. 3 illustrates a method that may improve the speed of chip routing for IC blocks.

FIG. 3 illustrates a method that may improve the speed of chip routing for IC blocks by selectively extracting a subset of the connections 215A-n such that the subset represents a fewer number of computations to verify that the proposed IC floor plan will pass the desired tests. In block 300, a layout abstract may be created for each block 205 and 210 in the IC. The particular format of the layout abstract may vary between embodiments. For example, in some embodiments, the layout abstract may be a graphical data system (GDS) file format, from Cadence Design Systems, which represents planar geometric shapes (i.e., polygons) of differing semiconductor manufacturing layers and their text labels. Other embodiments may include an open artwork system interchange standard (OASIS®) as the layout abstract. In still other embodiments, the layout abstract may include a library exchange format (LEF), which often identifies the layers available in a particular manufacturing technology, the wire routing rules (such as minimum metal width separation), the size and shape of the blocks, and the location of pins including the layer on which the pins are located.

Regardless of the particular implementation, the layout abstraction will indicate where, on each block, the pins are located and details regarding the connections of these pins to the pins of other blocks. For example, referring briefly back to FIG. 2C, the layout abstraction for blocks 205 and 210 would indicate the location of the blocks 205 and 210 within the layout of the processor 113, the location of the pins on block 205 that correspond to connections 215A-n, the location of the pins on block 210 that correspond to connections 215A-n, and details about the connections 215A-n between the blocks 205 and 210, such as length, material types, and proportions of each type.

Referring again to FIG. 3, in block 305 the number of common connections between blocks are analyzed to determine if the number of common connections exceeds a predetermined threshold. As will be described in detail below, the predetermined threshold may be determined based the desired number in the subset of connections that are used for simulation purposes. Also, for purposes of this disclosure, the term "common connection" refers to an electrically conductive path that is shared by at least two blocks in the IC. Thus, in some embodiments, the common connections may be a bus connection between two or more blocks in the IC. In some embodiments, the determination of block 305 may be made by analyzing the layout abstract, which may include information about the connections between blocks such as the constituent metals used and/or the lengths of the connections. In other embodiments, this determination may be made by analyzing a representation of the circuit schematic associated with the layout view. Such circuit schematic representations are often referred to as "netlists", such as the type used by the Simulation Program with Integrated Circuit Emphasis (SPICE), which is commonly used for simulation purposes during IC design.

If the number of common connections between blocks does not exceed the predetermined threshold, then the parasitic elements associated with the proposed floor plan may be extracted from the layout abstract to generate an LPE representation per block 307. This LPE representation may be simulated per block 309. As will be described in further detail below, the precise value of the threshold may vary between embodiments.

Figure 4A:
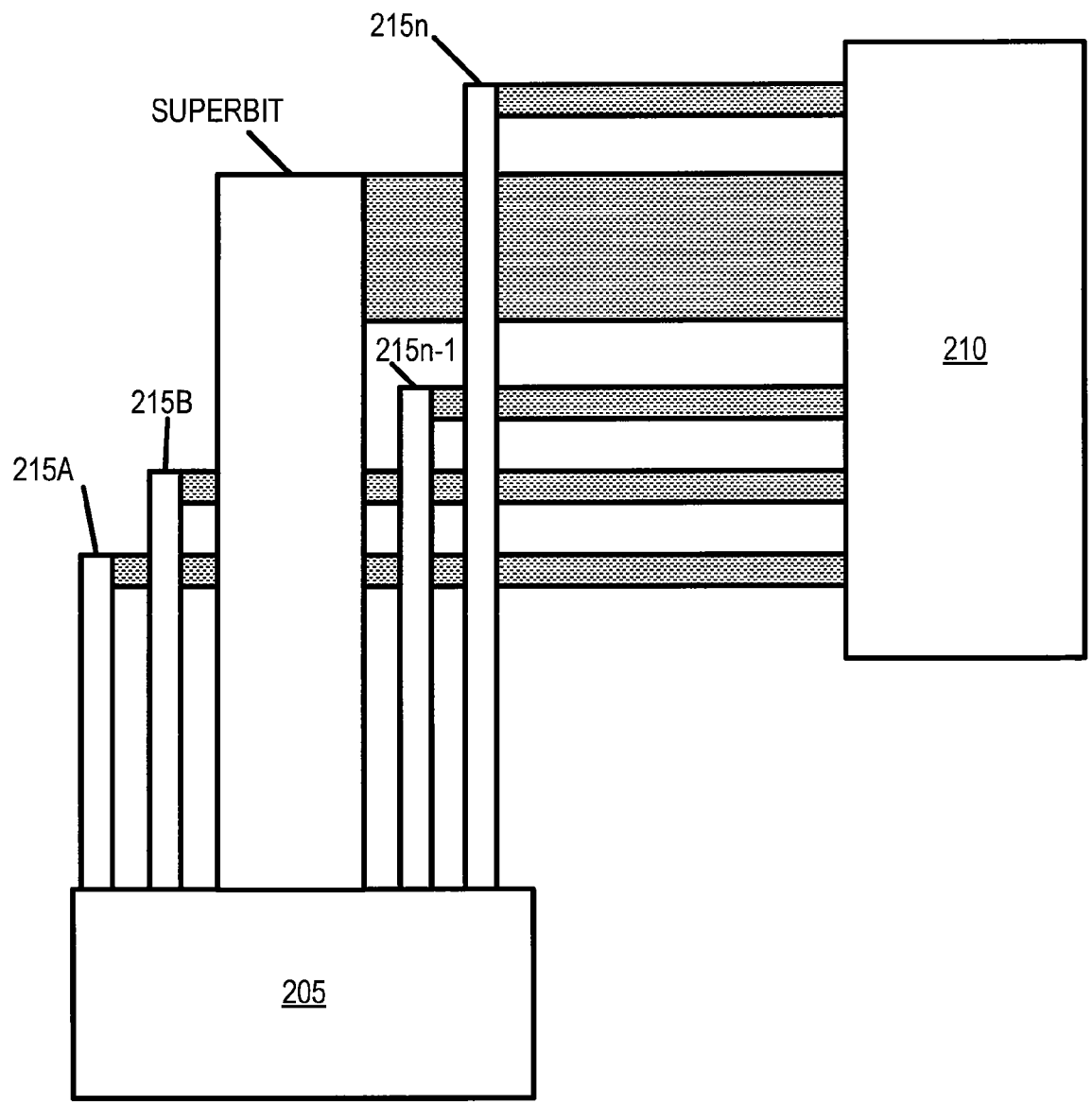
FIG. 4A illustrates forming a superbit with regard to the embodiment shown in FIG. 2C.
Figure 4B:
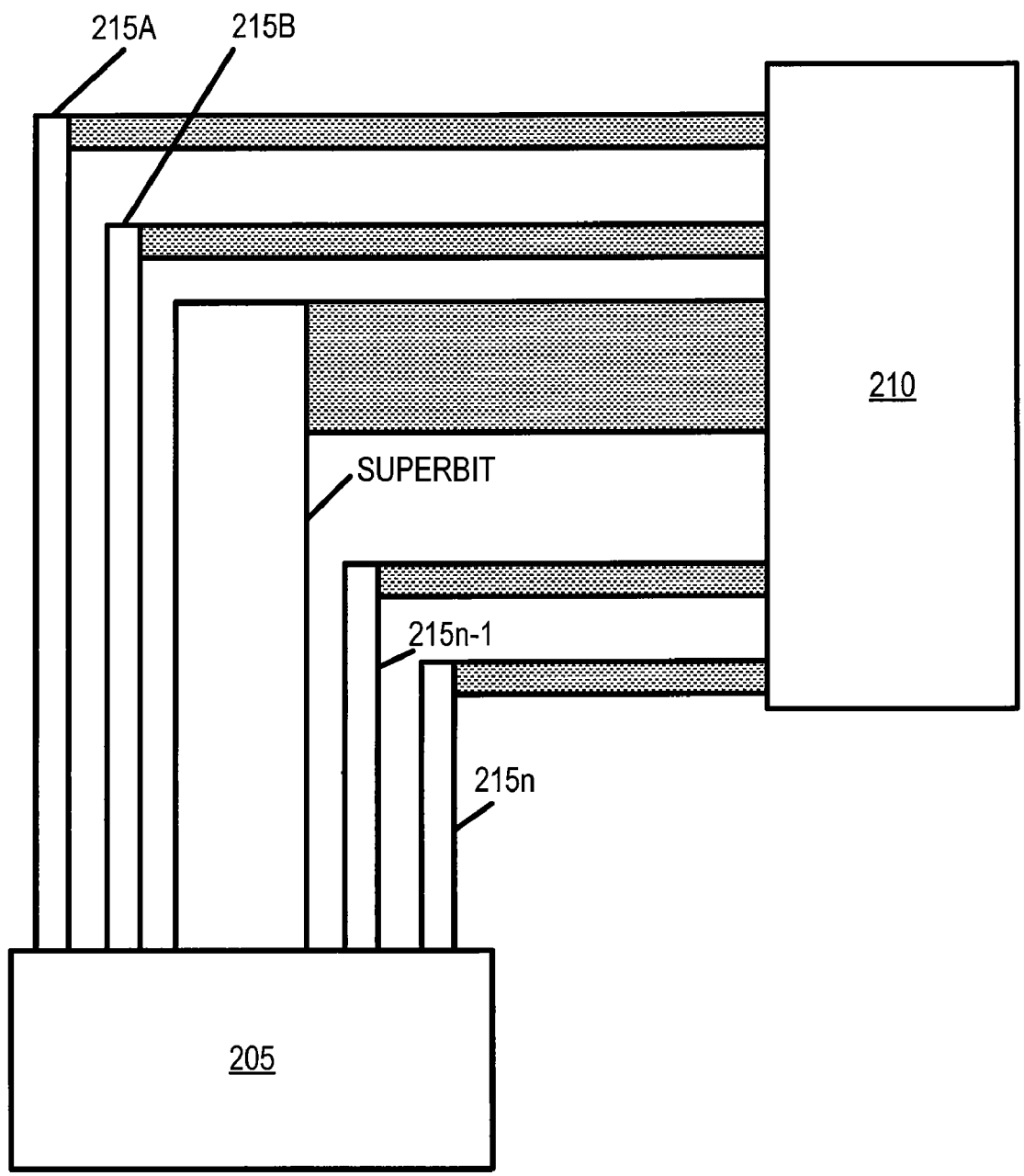
FIG. 4B illustrates forming a superbit with regard to the embodiment shown in FIG. 2D.

If, on the other hand, the number of common connections between blocks exceeds the predetermined threshold, then a "superbit" may be created (per block 310) prior to extraction (per block 307) and simulation (per block 309), thereby saving extraction and simulation time. A "superbit" refers to a logical construct (within the layout abstract) where a subset of common connections (usually in bus form) are represented as a single common connection. FIGS. 4A-B illustrate forming a superbit with regard to the embodiments shown in FIGS. 2C-D respectively.

Referring initially to FIGS. 4A and 2C, the superbit has been chosen so as to represent the connections 215C through 215n-2. In this manner, the superbit may be logically represented in the layout abstract as a single connection that is between the connections 215B and 215n-1. As mentioned previously, the connections 215A-n shown in FIG. 2C have similar lengths and topologies, and therefore the superbit may accurately represent the area of the IC where the connections 215C through 215n-2 may occur. More specifically, the superbit may be used as a placeholder during computationally intensive operations such as the LPE representation and/or timing simulations. In other words, the superbit may designate an area associated with connections that are not being routed in detail. Thus, connections 215A-C and 215n-2 through 215n may be routed in detail and be used for LPE representations and timing simulations whereas the connections associated with the superbit may not be routed in detail or used for LPE representation and/or timing simulations. By excluding the connections designated within the superbit, valuable simulation time may be saved.

For example, comparing the number of connections shown in FIGS. 4A and 2C respectively, the number of connections that ultimately would be extracted and simulated is 5 in FIG. 4A and is n in FIG. 2C. In some embodiments, the bus between the blocks 205 and 210 may be 128 bits wide, and therefore, n would equal 128 and the potential savings, for extraction and simulation purposes, would be 123 connections. Given the overall trend in integrated circuitry to incorporate greater amounts of processing abilities on chip, the bus sizes between blocks will continue to grow such that even greater amounts of extraction and simulation time may be saved by using a superbit. Thus, employing a superbit may be even more desirable with future generations of integrated circuitry.

The precise method of designating the superbit may vary between embodiments. For example, in some embodiments, when the netlist or other file indicates multiple common connections between two blocks, the layout abstract may be modified (manually or automatically) to include a blocking layer over the pins and wires associated with the common connections and form a superbit in their place. This blocking layer may indicate that each of those pins should be extracted and simulated as one pin, which may reduce the amount of time consumed by blocks 307 and 309. In some embodiments, especially where the connections 215A-n include a power grid interleaved within the connections 215A-n on the same conductive layer (e.g., connections 215A-n and power grid both on the metal 2 layer), the blocking layer may be sized to include this power grid in addition to the connections that are being represented as a superbit.

It should be noted that each of the connections 215A-n may be represented as part of the superbit. In some embodiments, however, the precise connections chosen to represent a superbit may be chosen at the exclusion of others. For example, FIG. 4B illustrates implementing a superbit for connections 215C through 215n-2 shown in FIG. 2D. The embodiment shown in FIG. 2D illustrates a more extreme case of timing differences across the bus than FIG. 2C. That is, the timing delay associated with the connection 215A (in FIG. 2D) may be greater than the timing delay associated with the connection 215n because of a difference between the lengths of the connection 215A and the connection 215n. Since the two connections 215A and 215n may experience the largest difference in overall timing, ensuring that the connections 215A and 215n are extracted and simulated, rather than estimated, by excluding the connections 215A and 215n from the superbit estimation, may be desirable in providing insight into whether the proposed floor plan shown in FIG. 4B will pass the requisite timing tests.

Other connections may be excluded from the superbit in order improve the overall accuracy of the model. For example, referring briefly back to FIG. 2B, with regard to connection 215A, since the connection 215A is the end connector in the bus, there is no connection to the left and the connection 215A alone may not accurately model the parasitic capacitance value associated with capacitor 220B. In other words, the LPE representation of the connection 215A may not adequately represent the LPE representation of the connection 215B, for example, because the connection 215B has parasitic capacitances 220B on both the left and the right of connection 215B. Thus, the superbit representation shown in FIG. 4B may exclude the connections 215B and 215n-1 so that the connections 215A and 215n are not used to model the connections 215B and 215n-1. In some embodiments, the predetermined threshold (per block 305), may be 8 such that busses with greater than 8 connections are reduced down to 5 connections (for simulation and extraction purposes) regardless of the original size of the bus.

Figure 5:
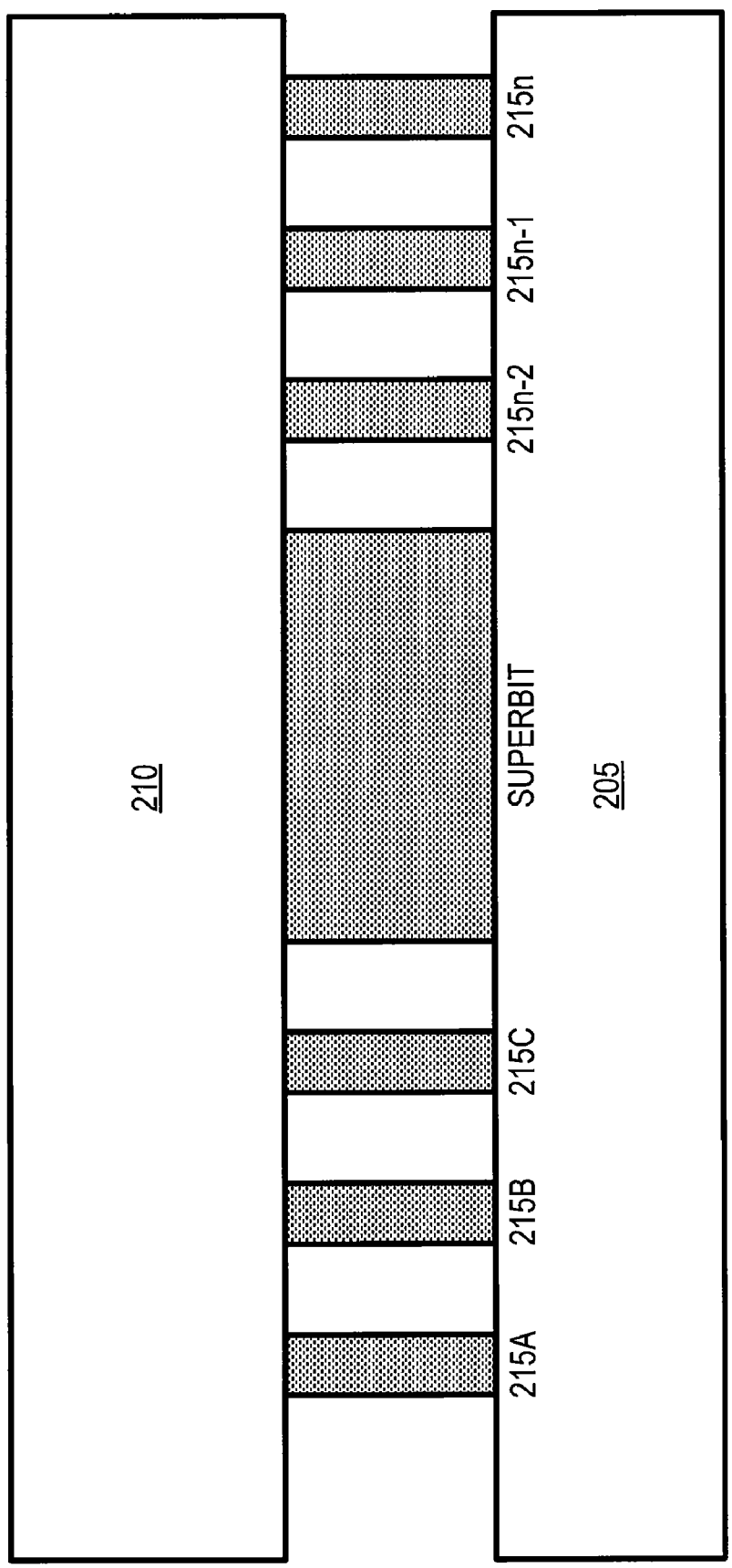
FIG. 5 illustrates certain connections that may be selected for the superbit.

Similarly, it may be desirable to ensure that one or more of the connections 215A-n are between two connections that will actually be extracted and simulated rather than modeled as a superbit. Again, this may be to ensure that certain parasitic elements are included in the simulations. Thus, as shown in FIG. 5 (where the connections 215A-n are shown in stippled metal 2 for clarity), connections 215C and 215n-2 may be excluded from the superbit, thereby ensuring that the connections 215B and 215n-1 are extracted and simulated as being truly between two other extracted connections.

Figure 6:
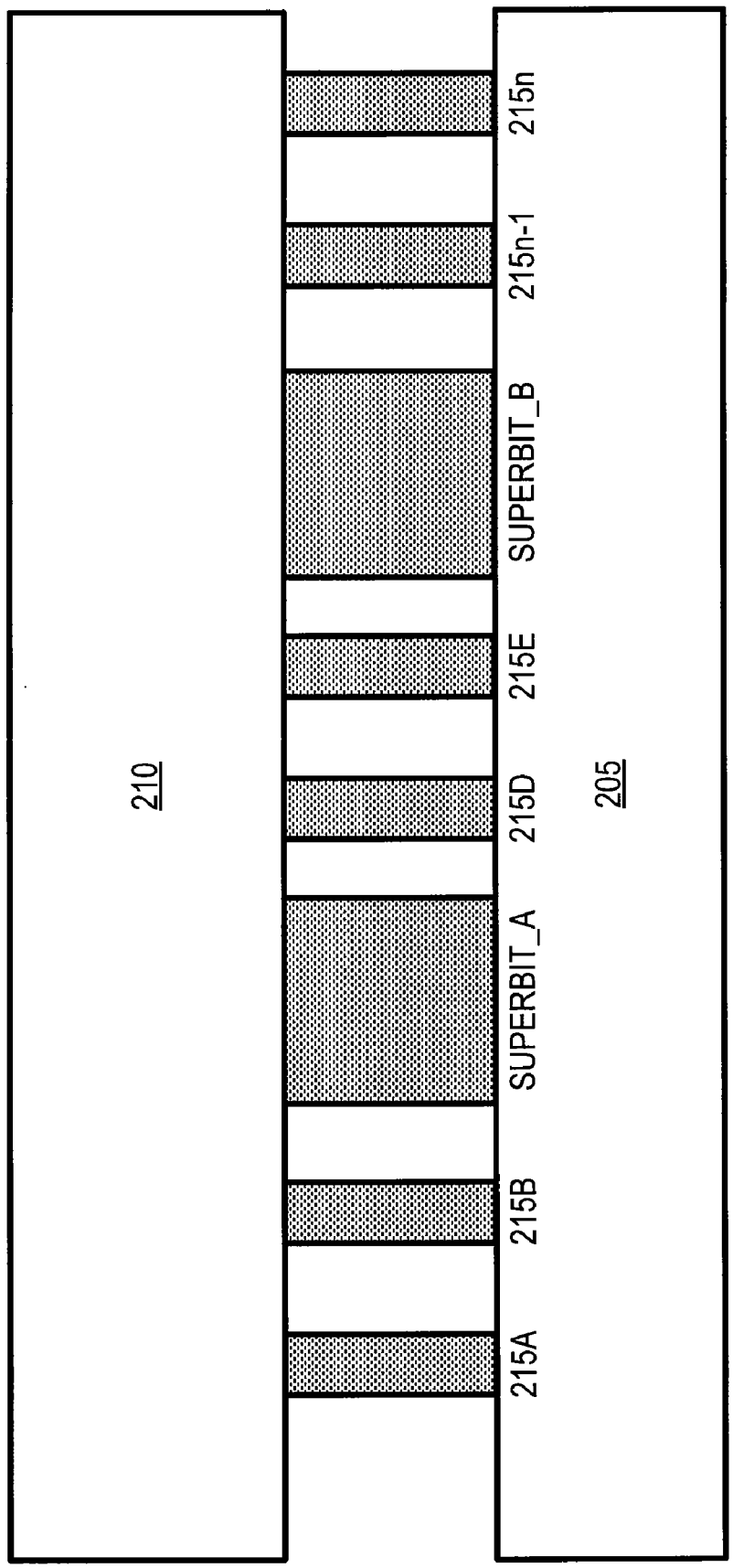
FIG. 6 illustrates additional connections that may be selected for the superbit.

In still other embodiments, especially the embodiments where the bus formed by the connections 215A-n is large, the variation between the left most connection (e.g., 215A) and the right most connection (e.g., 215n) may be large. When the variation is large, one or more connections in the middle of the bus may be excluded from the superbit representation to increase the accuracy of the LPE representation of the superbit. Thus, as shown in FIG. 6 (where the connections 215A-n are shown in stippled metal 2 for clarity), multiple superbit representations (e.g., superbits A and B) may be formed in block 310, where connections 215D and 215E may be deliberately excluded from superbit representation so as to increase the accuracy of the LPE representation.

The above discussion is meant to be illustrative of the principles and various embodiments of the present invention. Numerous variations and modifications will become apparent once the above disclosure is fully appreciated. The claims should be interpreted to include any and all such variations and modifications. In addition, the above description has broad application, and the discussion of any embodiment is meant only to be exemplary, and is not intended to intimate that the scope of the disclosure, including the claims, is limited to these embodiments.

What is claimed is:
1. A method for floor planning an integrated circuit, the method comprising the acts of:
 creating, utilizing a processor, a layout abstract for a first block and a second block of the integrated circuit, wherein the first and second blocks are coupled together via a plurality of connections;

determining whether the number of connections in the plurality exceeds a threshold number;

determining a first subset of the plurality of connections, the first subset comprising connections having substantially similar length and topology; and in the event that the number of connections exceeds the threshold number, representing the first subset of the plurality as a first logical connection.

2. The method of claim 1, wherein the act of representing comprises the act of modifying the layout abstract to include the first logical connection instead of the connections in the first subset.

3. The method of claim 2, wherein the act of modifying includes the act of implementing at least one blocking layer prevents one or more of the plurality of connections from being simulated.

4. The method of claim 3, wherein the blocking layer includes at least one power grid in addition to the connections.

5. The method of claim 2, wherein the number of connections used in an extracted representation of the integrated circuit is 5 or less.

6. The method of claim 1, further comprising the acts of extracting parasitic electrical elements and excluding connections that exceed the threshold number from the first logical connection from the extraction.

7. The method of claim 1, further comprising the act of simulating the integrated circuit prior to manufacture and the act of representing occurs during the act of simulating.

8. The method of claim 1, wherein the threshold is 8.

9. The method of claim 1, wherein a first connection and a last connection within the plurality of connections are not included in the first subset.

10. The method of claim 1, wherein in the event that the number of connections exceeds the threshold, the method further comprises the act of representing a second subset of the plurality as a second logical connection, wherein the first and second subsets are distinct.

11. The method of claim 10, wherein at least one connection within the plurality of the connections is located between the first and second logical connections.

12. A non-transitory computer readable storage medium comprising a plurality of computer readable instructions, the instructions comprising:

creating a layout abstract for a first block and a second block of an integrated circuit, wherein the first and second blocks are coupled together via a plurality of connections;

determining whether the number of connections in the plurality exceeds a threshold;

determining a subset of the plurality of connections, the subset comprising connections having substantially similar length and topology; and in the event that the number of connections exceeds the threshold, representing the subset of the plurality as a logical connection.

13. The computer readable medium of claim 12, wherein representing the subset of the plurality as the logical connection comprises modifying the layout abstract.

14. The computer readable medium of claim 13, wherein modifying the layout abstract includes the act of implementing at least one blocking layer.

15. The computer readable medium of claim 13, wherein the threshold is at least 8 and the total number of connections for extraction purposes is 5 or less.

16. The computer readable medium of claim 12, wherein the connections for the logical connection are chosen such that a first connection and a last connection within the plurality of connections are excluded.

17. The computer readable medium of claim 16, wherein the connections for the logical connections are chose such that the second and second to last connections are excluded.

* * * * *